(12) United States Patent
Schwaiger et al.

(10) Patent No.: US 9,146,007 B2
(45) Date of Patent: Sep. 29, 2015

(54) APPARATUS FOR LIQUID TREATMENT OF WORK PIECES AND FLOW CONTROL SYSTEM FOR USE IN SAME

(71) Applicant: LAM RESEARCH AG, Villach (AT)

(72) Inventors: Michael Schwaiger, Drobollach (AT); Alois Goller, Villach (AT); Christopher Miggitsch, Riegersdorf (AT)

(73) Assignee: LAM RESEARCH AG, Villach (AT)

( * ) Notice: Subject to any disclaimer, the term of this patent is extended or adjusted under 35 U.S.C. 154(b) by 281 days.

(21) Appl. No.: 13/686,527

(22) Filed: Nov. 27, 2012

(65) Prior Publication Data
US 2014/0144529 A1 May 29, 2014

(51) Int. Cl.
*F16K 31/02* (2006.01)
*F17D 1/00* (2006.01)

(52) U.S. Cl.
CPC .............. *F17D 1/00* (2013.01); *Y10T 137/8158* (2015.04)

(58) Field of Classification Search
CPC ............................ F17D 1/00; Y10T 137/8158
USPC ......... 137/487.5, 486, 487, 488, 503, 599.06, 137/599.07; 251/129.17; 156/346.12, 156/345.13, 345.14, 345.145
See application file for complete search history.

(56) References Cited

U.S. PATENT DOCUMENTS

| | | | | |
|---|---|---|---|---|
| 3,081,942 A * | 3/1963 | Maclay | ........................... | 341/151 |
| 3,740,019 A * | 6/1973 | Kessell et al. | ............. | 251/129.17 |
| 3,905,394 A * | 9/1975 | Jerde | ........................ | 137/599.04 |
| 4,030,523 A * | 6/1977 | Cram et al. | .............. | 137/599.07 |
| 4,275,752 A * | 6/1981 | Collier et al. | ....................... | 137/7 |
| 4,376,447 A * | 3/1983 | Chumley | ....................... | 137/244 |
| 4,438,731 A * | 3/1984 | Maggio | ........................ | 123/25 N |
| 4,518,011 A * | 5/1985 | Stoll | ......................... | 137/596.17 |
| 4,903,717 A | 2/1990 | Sumnitsch | | |
| 5,313,871 A * | 5/1994 | Kaneko et al. | ................... | 91/361 |
| 5,329,965 A * | 7/1994 | Gordon | ..................... | 137/599.07 |
| 5,520,333 A * | 5/1996 | Tofte | ................ | 239/10 |
| 6,029,903 A * | 2/2000 | Fukano et al. | ................. | 239/119 |
| 6,059,920 A * | 5/2000 | Nojo et al. | ................ | 156/345.12 |
| 6,096,162 A * | 8/2000 | Lin et al. | ................... | 156/345.12 |
| 6,199,582 B1 | 3/2001 | Matsuzawa et al. | | |
| 6,725,878 B1 * | 4/2004 | Nawa et al. | ................. | 137/487.5 |
| 7,069,944 B2 * | 7/2006 | Morikawa et al. | .......... | 137/487.5 |
| 7,070,160 B2 * | 7/2006 | Ijichi et al. | .................... | 251/63.5 |
| 7,155,319 B2 * | 12/2006 | Nangoy et al. | ................. | 700/281 |
| 7,163,024 B2 * | 1/2007 | Igawa et al. | ................... | 137/486 |
| RE43,288 E * | 4/2012 | Sund et al. | ................. | 137/487.5 |
| 8,365,762 B1 * | 2/2013 | Trotter | ........................ | 137/487.5 |
| 8,555,920 B2 * | 10/2013 | Hirata et al. | ............. | 137/599.07 |
| 2003/0111178 A1 * | 6/2003 | Morita | ......................... | 156/345.33 |
| 2004/0206454 A1 * | 10/2004 | Chopra et al. | ............ | 156/345.12 |
| 2005/0166975 A1 * | 8/2005 | Gilbert et al. | ............ | 137/599.07 |

(Continued)

*Primary Examiner* — Craig Schneider
*Assistant Examiner* — Minh Le
(74) *Attorney, Agent, or Firm* — Young & Thompson

(57) ABSTRACT

A flow control system in an apparatus for treating a work piece controls a flow rate of treatment liquid dispensed from a liquid dispenser. The system includes a flow meter that measures a flow rate of liquid being supplied to the liquid dispenser, a controller that receives signals indicative of a flow rate measured by the flow meter, and a pressure regulator that regulates pressure of the liquid supply downstream of the flow meter based on control signals from the controller. At least two alternative liquid supply paths are provided downstream of the pressure regulator and upstream of an outlet of the liquid dispenser. Each supply path is equipped with a respective shutoff valve and provides a respectively different pressure drop to the treatment liquid.

15 Claims, 2 Drawing Sheets

(56) References Cited

U.S. PATENT DOCUMENTS

2006/0108552 A1* 5/2006 Herbert et al. ........... 251/129.17
2006/0226123 A1* 10/2006 Birang ............................ 216/88
2007/0238395 A1* 10/2007 Kimura et al. .................... 451/6
2008/0041459 A1* 2/2008 Olander ........................ 137/487
2012/0286180 A1* 11/2012 Mehling et al. .......... 251/129.05
2014/0000808 A1* 1/2014 Singh et al. ............... 156/345.13

* cited by examiner

_US 9,146,007 B2_

APPARATUS FOR LIQUID TREATMENT OF WORK PIECES AND FLOW CONTROL SYSTEM FOR USE IN SAME

BACKGROUND OF THE INVENTION

1. Field of the Invention

The invention relates to an apparatus for liquid treatment of work pieces, and a flow control system for use in such apparatus.

2. Description of Related Art

In the semiconductor industry, semiconductor wafers undergo liquid treatment that may include both wet etching and wet cleaning, wherein the surface area of a spinning wafer to be treated is wetted with a treatment liquid and a layer of the wafer is thereby removed or impurities are thereby carried off. A device for liquid treatment is described in U.S. Pat. No. 4,903,717. In this device the distribution of the liquid on the wafer surface may be assisted by the rotational motion imparted to the wafer.

For current technology nodes in the semiconductor industry, it is widely accepted to manually adjust the flow of a given treatment liquid once at installation/setup time, and thereafter to keep this flow constant during processing wafers. Changing the flow rate requires stopping the machine and performing manual adjustments to needle valves or similar components.

However, future technology nodes will likely need more flexible flow setting capabilities. It would be desirable to allow for two or more different, but constant flows while processing one wafer, each flow rate corresponding to a specific process step. It would also be desirable to allow for flow rates that change steadily from an initial value to a final value, with these values being selected in advance based upon the specific recipe used for wafer processing.

A conventional flow control module 50 for closed-loop control of the volumetric flow of liquid is shown schematically in FIG. 1. An ultrasonic flow meter 52 provides a signal via output interface 54 to controller 56, which in turn outputs a signal to an electrically controlled needle valve 58 so as to adjust the flow rate in accordance with the input received from the flow meter 52.

However, such flow control modules are not well suited for use in processing semiconductor wafers and other processes for treating work pieces that are highly sensitive to particulate contamination, because the mechanically moving parts of the needle valve 58 are a source of such contamination. Moreover, the response time of the needle valve 58 can be slower than is desired for some processes, and the provision of the components in a single module 50 prevents those components from being maintained, repaired or replaced on an individual basis.

Another conventional flow control system for closed-loop control of the volumetric flow of liquid is shown schematically in FIG. 2. A first module 60 contains an ultrasonic flow meter 62 and output interface 64 as described above, with a signal processor 72 being provided in a separate module 70. The signal processor 72 provides its output to a controller 82 contained in a module 80, and this controller 80 provides an output signal to an electro pneumatic converter 84, which in turn controls a pressure regulator 86. Pressure regulator 86 is of the type having a valve chamber delimited by the inner sides of a pair of interconnected diaphragms, on the outer sides of which are upper and lower chambers whose pressures are controlled pneumatically.

While this system is not attended by the particulate contamination associated with the first conventional example, the range of available liquid flow rates is too limited to meet anticipated needs for a variety of work piece processes including impending technology nodes in the semiconductor industry. Moreover, the provision of the electronic controller, pressure regulator and liquid conduit in the same module 80 also limits how the system can be maintained and repaired.

SUMMARY OF THE INVENTION

Thus, in one aspect, the present invention relates to an apparatus for treating a work piece, comprising a holder configured to hold a work piece in a predetermined orientation, a liquid dispenser positioned relative to the holder so as to dispense a treatment liquid onto a surface of a work piece when positioned on the holder, and a flow control system that controls a flow rate of treatment liquid dispensed from the liquid dispenser. The flow control system comprises a flow meter that measures a flow rate of liquid being supplied to the liquid dispenser, a controller that receives signals indicative of a flow rate measured by the flow meter, a pressure regulator that regulates pressure of the liquid supply downstream of the flow meter based on control signals from the controller, and at least two alternative liquid supply paths downstream of the pressure regulator and upstream of an outlet of the liquid dispenser. Each of the at least two alternative supply paths is equipped with a respective shutoff valve and provides a respectively different pressure drop to liquid when passing through a respective one of the at least two alternative supply paths.

In preferred embodiments of the apparatus according to the present invention, the flow meter is an ultrasonic flow meter.

In preferred embodiments of the apparatus according to the present invention, the pressure regulator comprises a valve chamber delimited by inner surfaces of a pair of diaphragms and upper and pneumatically controlled pressure chambers delimited by respective outer surfaces of the pair of diaphragms.

In preferred embodiments of the apparatus according to the present invention, the flow control system further comprises an electro pneumatic converter receiving control signals from the converter based upon readings of the flow meter and pneumatically controlling the pressure regulator based upon the control signals received from the controller.

In preferred embodiments of the apparatus according to the present invention, each of the shutoff valves is a solenoid-actuated diaphragm valve controlled by signals issued from the controller.

In preferred embodiments of the apparatus according to the present invention, the flow control system comprises at least three of the alternative liquid supply paths.

In preferred embodiments of the apparatus according to the present invention, the at least two alternative liquid supply paths comprise conduits of a same diameter each communicating with corresponding orifices of respectively different diameters.

In preferred embodiments of the apparatus according to the present invention, the at least two alternative liquid supply paths comprise conduits of respectively different diameters.

In preferred embodiments of the apparatus according to the present invention, the holder is a spin chuck in a process module for single wafer wet processing of semiconductor wafers.

In preferred embodiments of the apparatus according to the present invention, the flow meter is contained within a first module mounted within a wet chemical treatment region of the apparatus, the controller is contained within a second module mounted within an electronics cabinet of the apparatus, and the pressure regulator and the shutoff valves are contained within a third module mounted within the wet chemical treatment region of the apparatus.

In another aspect, the present invention relates to a flow control system for controlling a flow rate of treatment liquid dispensed from a liquid dispenser in an apparatus for treating a work piece. That flow control system comprises a flow meter that measures a flow rate of liquid being supplied through a conduit, a controller that receives signals indicative of a flow rate measured by the flow meter, a pressure regulator that regulates pressure of a liquid supply downstream of the flow meter based on control signals from the controller, and at least two alternative liquid supply paths downstream of the pressure regulator, each of the at least two alternative supply paths being equipped with a respective shutoff valve and providing a respectively different pressure drop to liquid when passing through a respective one of the at least two alternative supply paths.

In preferred embodiments of the flow control system according to the present invention, the flow meter is an ultrasonic flow meter, and the pressure regulator comprises a valve chamber delimited by inner surfaces of a pair of diaphragms and upper and pneumatically controlled pressure chambers delimited by respective outer surfaces of the pair of diaphragms.

In preferred embodiments of the flow control system according to the present invention, the flow control system further comprises an electro pneumatic converter receiving control signals from the converter based upon readings of the flow meter and pneumatically controlling the pressure regulator based upon the control signals received from the controller.

In preferred embodiments of the flow control system according to the present invention, each of the shutoff valves is a solenoid-actuated diaphragm valve controlled by signals issued from the controller.

In preferred embodiments of the flow control system according to the present invention, the flow meter is contained within a first module, the controller is contained within a second module, and the pressure regulator and the shutoff valves are contained within a third module.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
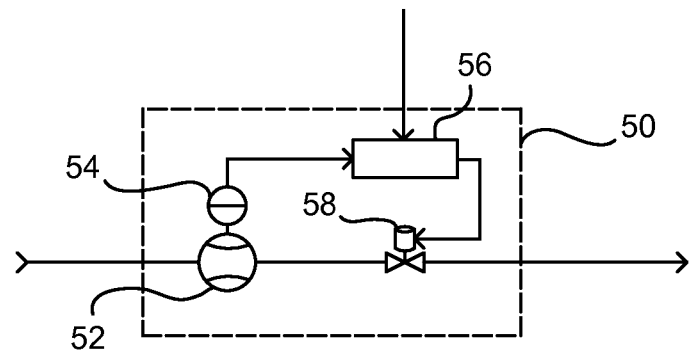
FIG. 1 is a schematic diagram of a first example of a conventional flow control module.
Figure 2:
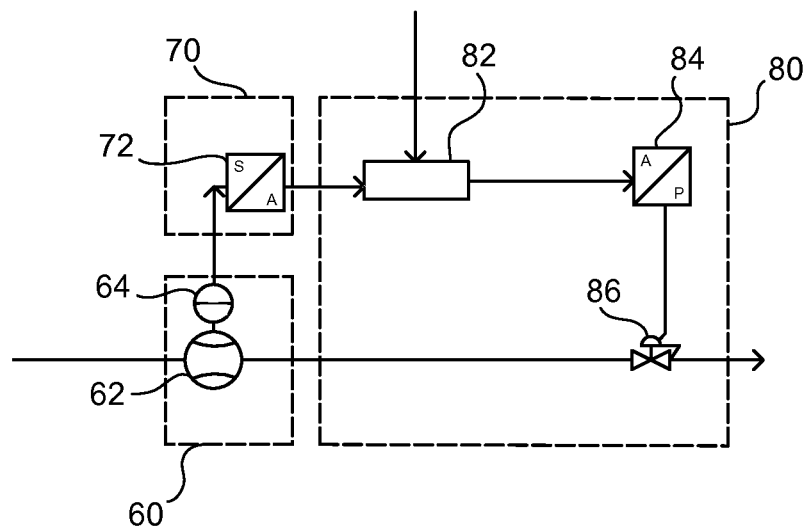
FIG. 2 is a schematic diagram of a second example of a conventional flow control system.
Figure 3:
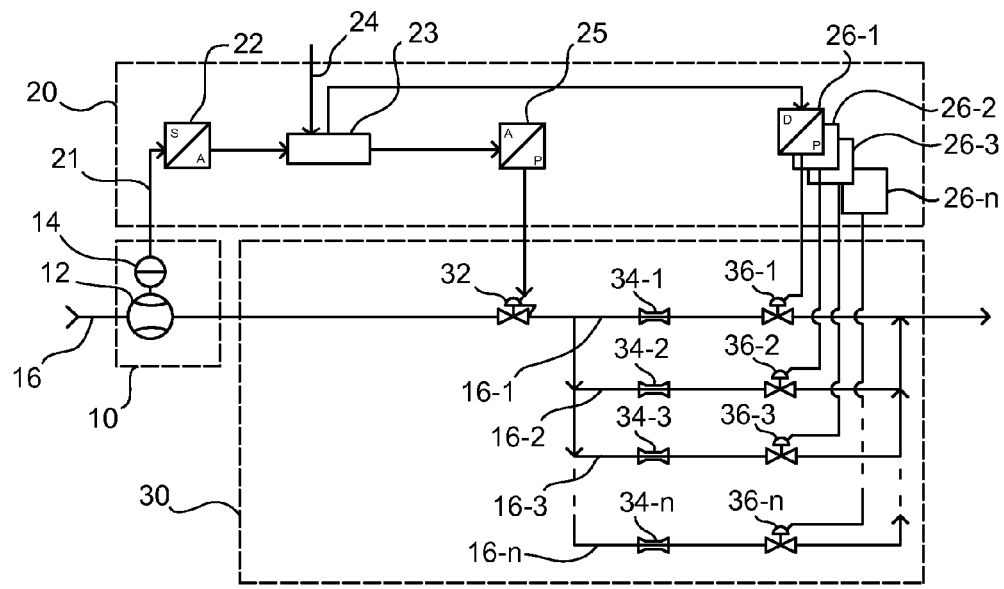
FIG. 3 is a schematic diagram of an embodiment of a flow control system according to the present invention.

The improved flow control system shown in FIG. 3 has its components distributed over three modules 10, 20 and 30. Modules 10 and 30 are mounted within the wet chemical area of the processing apparatus, and so are designed to withstand the conditions that prevail there, which include not only moisture but also, depending upon the particular process, extreme temperatures and highly corrosive chemical recipes. As such, the bodies of these modules are formed of suitable temperature and chemical resistant materials such as polytetrafluoroethylene (PTFE), polyetheretherketone (PEEK), polyvinylidene difluoride (PVDF), perfluoroalkoxy (PFA) and the like.

Module 10 contains an ultrasonic flow meter 12 and its associated output interface 14. Treatment liquid enters and exits the module 10 via a suitable conduit 16. The ultrasonic flow meter is preferably of the type in which the sensing elements are positioned outside of the liquid passage, i.e., in a non-contacting relationship to the liquid. Such sensors in practice normally include a U-shaped or Z-shaped internal fluid passage to which inlet and outlet liquid conduit is connected. The flow sensing principle is preferably based upon a pair of piezoelectric transducers mounted facing one another external to the measuring section of the internal fluid passage. These transducers alternately generate and receive ultrasonic waves, such that the wave travelling with the fluid is accelerated and the wave travelling against the fluid is slowed, with the difference in transit times of the wave signals being proportional to the velocity of the fluid and hence its flow rate through a passage of known dimensions.

The output interface 14 of the flow meter 12 provides a signal via signal line 21 to a signal converter 22 in module 20, which in turn provides a signal output to controller 23. Controller 23 furthermore receives a signal input on line 24 from the main controller of the apparatus, according to the process to be performed. Module 20 also contains an electro pneumatic converter 25, of a design known per se, that receives an analog output signal from controller 23 that is generated based upon the flow rate measured by flow meter 12, and whose pneumatic output is used to control valve 32 in module 30, as discussed in greater detail below.

Controller 23 also has digital outputs providing commands to signal converters 26-1, 26-2, 26-3, ... 26-n, which in turn output control signals to corresponding shutoff valves in the module 30, as will also be discussed in greater detail below.

As the module 20 will be mounted in the electronics cabinet of the apparatus, it need only withstand the environmental conditions of such a cabinet, but need not withstand the more extreme conditions prevailing within the wet chemical tool environment. For example, the components of module 20 could be mounted on a printed circuit board or integrated onto a common chip, with or without its own housing. Alternatively, these components may if desired be integrated into the electronic controls of the overall controller of the apparatus.

Module 30 in this embodiment includes a valve 32 that receives at its liquid inlet the conduit 16 carrying the treatment liquid whose flow rate has been measured by the flow meter 12, and which is actuated pneumatically by appropriate hoses connected to the outputs of the electro pneumatic converter 25. In particular, valve 32 is preferably of the type in which a valve chamber through which the treatment liquid passes is delimited by inner surfaces of a pair of upper and lower diaphragms. The outer surfaces of these diaphragms in turn delimit upper and lower pressure chambers respectively above and below the valve chamber. The pressure within these upper and lower chambers is pneumatically controlled via the electro pneumatic converter 25, which in turn controls the pressure within the valve chamber of valve 32 and hence the flow rate of treatment liquid passing through valve 32. Valve 32 may be constructed for example as described in U.S. Pat. No. 6,199,582.

Downstream of valve 32, the conduit 16 is branched into a plurality of n alternative liquid supply paths designated 16-1, 16-2, 16-3, ... 16-n in FIG. 3. Although in FIG. 3 the number of such paths is at least four, according to the present invention the number of such paths may be as few as two and up to any desired number, with three such paths being a configuration preferred at present. Each flow path 16-1, 16-2, 16-3, . . . 16-n includes a respective orifice passage 34-1, 34-2, 34-3, . . . 34-n, and these orifice passages have diameters that differ from one another. The orifice diameters are preferably in a range 0.3 mm to 2.5 mm; thus, for example, for a configuration with three flow paths and orifices, the diameters could be 0.3 mm, 1 mm, and 2 mm. A typical diameter for conduit 16 upstream and downstream of these orifices is ⅜".

However, it will be appreciated that any other suitable technique of providing a series of different pressure drops in the alternative fluid supply paths may be employed, for example by utilizing for the branch conduits 16-1, 16-2, 16-3, . . . 16-n tubing of respectively different diameters, in which case orifice passages 34-1, 34-2, 34-3, . . . 34-n could be omitted. In that case it is preferred that no branch conduit 16-1, 16-2, 16-3, . . . 16-n have a diameter greater than that of the main conduit 16, for purposes of maintaining sufficient back pressure to the flow meter 12.

Each branch conduit 16-1, 16-2, 16-3, . . . 16-n is equipped with a respective automatic shutoff valve 36-1, 36-2, 36-3, . . . 36-n, with these valves being actuated by the signals output from signal converters 26-1, 26-2, 26-3, . . . 26-n in module 20. In this embodiment the shutoff valves are a diaphragm-type on-off valve with an integrated solenoid actuator that is controlled by signals issued from signal converters 26-1, 26-2, 26-3, . . . 26-n in module 20.

Alternatively, the signal converters and solenoid actuators could be integrated and contained within module 20, with pneumatic control tubing extending into module 30 to control the shutoff valves 36-1, 36-2, 36-3, . . . 36-n.

Downstream of the shutoff valves 36-1, 36-2, 36-3, . . . 36-n, the branch conduits are reunited to form again a single liquid supply conduit 16.

Figure 4:
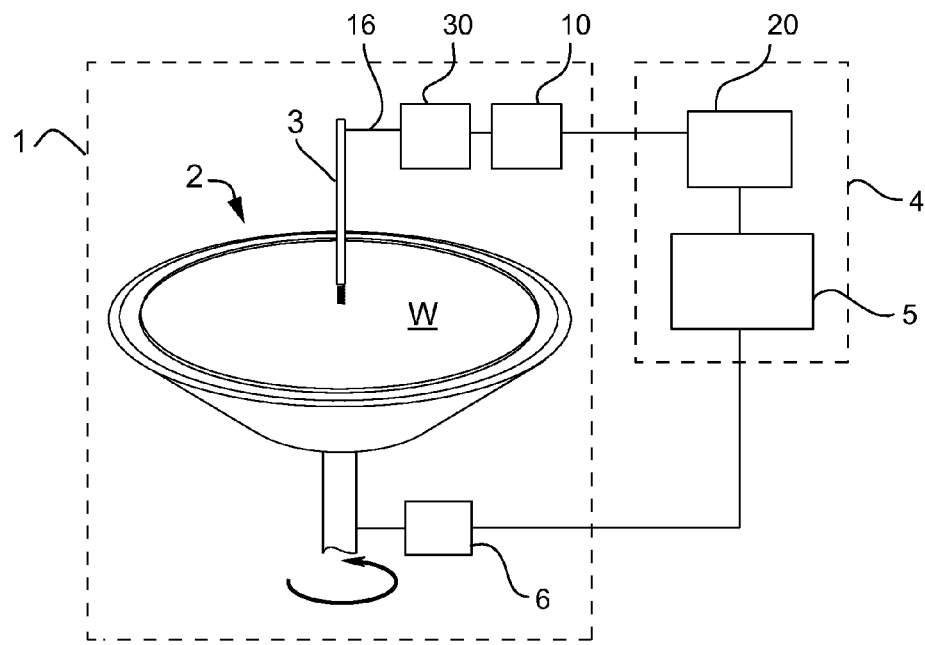
FIG. 4 is a schematic diagram of an embodiment of an apparatus for treating work pieces according to the present invention.

Turning now to FIG. 4, the flow control system of FIG. 3 is shown installed in an apparatus for wet processing of semiconductor wafers. Such an apparatus includes an enclosure 1 within which wet chemical processes are performed, and a spin chuck 2 mounted within that enclosure 1. A semiconductor wafer W is held and rotated by the spin chuck 2 during processing. A liquid dispenser 3 dispenses treatment liquid onto a surface of the spinning wafer W via an outlet at its lower end.

Liquid dispenser 3 is fitted with the module 30 as described above, and module 10 as described above is also mounted within enclosure 1, with the module 10 being supplied with treatment liquid from a liquid supply source (not shown). Separately from the enclosure 1, there is provided an electronics cabinet 4 in which the module 20 is mounted. Cabinet 4 will also typically include the main controller 5 of the apparatus, which controls various other operations such as the operation of a motor 6 that drives the spin chuck 2 in rotation.

Single wafer wet processing of semiconductor wafers typically proceeds through a series of process modules, each of which contains a group of spin chucks such as that described in U.S. Pat. No. 4,903,717. The electronics cabinet 4 and main controller 5 may control a plurality of spin chucks and flow control systems within a given process module.

In use, the flow rate measured by flow meter 12 is utilized by controller 23 to operate the valve 32 via electro pneumatic converter 25, thereby to provide closed-loop control of the volumetric flow of liquid flowing through conduit 16. Depending upon the desired output flow rate of treatment liquid, the controller 23 is also instructed by the main system controller 5 to select the appropriate one of shutoff valves 36-1, 36-2, 36-3, . . . 36-n to open, with all of the remaining shutoff valves 36-1, 36-2, 36-3, . . . 36-n being kept closed. In this way, a constant flow rate at each of up to n values may be achieved. Additionally, however, the flow control system permits each of four different ranges of flow rates to be achieved, by the closed loop feedback control of valve 32 in combination with the appropriate selection among shutoff valves 36-1, 36-2, 36-3, . . . 36-n.

It will therefore be appreciated that the present invention overcomes the limitations of the conventional techniques discussed above, by providing a flow control system which is suitable for use in processing environments in which particulate contamination must be avoided, yet which can operate over a much wider range of flow rates than was previously possible in such systems.

Furthermore, the distribution of the components of the present flow control system among modules designed for the process ambient and designed for the electronics cabinet, further limits the risk of undesired contamination and significantly facilitates maintenance of the system as well as repair and replacement of individual components or modules.

While the present invention has been described in connection with various preferred embodiments thereof, it is to be understood that those embodiments are provided merely to illustrate the invention, and should not be used as a pretext to limit the scope of protection conferred by the true scope and spirit of the appended claims. For example, although in the above embodiments the modules 10 and 30 are separate components, they may instead be consolidated into a single module, so long as the system is configured to maintain sufficient backpressure for the ultrasonic flow meter 12 to work properly, as those skilled in the art will appreciate.

What is claimed is:

1. Apparatus for treating a work piece, comprising:
a holder configured to hold the work piece in a predetermined orientation;
a liquid dispenser positioned relative to said holder so as to dispense a treatment liquid onto a surface of the work piece when positioned on said holder; and
a flow control system that controls a flow rate of treatment liquid dispensed from said liquid dispenser, said flow control system comprising a flow meter that measures a flow rate of liquid being supplied to said liquid dispenser, a controller that receives signals indicative of a flow rate measured by said flow meter, a pressure regulator that regulates pressure of the liquid supply downstream of the flow meter based on control signals from said controller, and a plurality of liquid supply paths downstream of the pressure regulator and upstream of an outlet of said liquid dispenser, each of said plurality of liquid supply paths being equipped with a respective shutoff valve, wherein the controller is configured to select an appropriate one of shutoff valves with all of the remaining shutoff valves being kept closed to provide a respectively different pressure drop to liquid when passing through a respective one of said plurality of liquid supply paths.

2. The apparatus according to claim 1, wherein said flow meter is an ultrasonic flow meter.

3. The apparatus according to claim 1, wherein said pressure regulator comprises a valve chamber delimited by inner surfaces of a pair of diaphragms and upper and pneumatically controlled pressure chambers delimited by respective outer surfaces of said pair of diaphragms.

4. The apparatus according to claim 1, wherein said flow control system further comprises an electro pneumatic converter receiving control signals from said controller based upon readings of said flow meter and pneumatically controlling said pressure regulator based upon the control signals received from said controller.

5. The apparatus according to claim 1, wherein each of said shutoff valves is a solenoid-actuated diaphragm valve controlled by signals issued from said controller.

6. The apparatus according to claim 1, wherein said flow control system comprises at least three of said liquid supply paths.

7. The apparatus according to claim 1, wherein said at least two alternative liquid supply paths comprise conduits of a same diameter each communicating with corresponding orifices of respectively different diameters.

8. The apparatus according to claim 1, wherein said plurality of liquid supply paths comprise conduits of respectively different diameters.

9. The apparatus according to claim 1, wherein said holder is a spin chuck in a process module for single wafer wet processing of semiconductor wafers.

10. The apparatus according to claim 1, wherein said flow meter is contained within a first module mounted within a wet chemical treatment region of said apparatus, said controller is contained within a second module mounted within an electronics cabinet of said apparatus, and said pressure regulator and said shutoff valves are contained within a third module mounted within said wet chemical treatment region of said apparatus.

11. A flow control system for controlling a flow rate of treatment liquid dispensed from a liquid dispenser in an apparatus for treating a work piece, said flow control system comprising:
 a flow meter that measures a flow rate of liquid being supplied through a conduit;
 a controller that receives signals indicative of a flow rate measured by said flow meter;
 a pressure regulator that regulates pressure of a liquid supply downstream of the flow meter based on control signals from said controller; and
 a plurality of liquid supply paths downstream of the pressure regulator, each of said plurality of liquid supply paths being equipped with a respective shutoff valve, wherein the controller is configured to select an appropriate one of shutoff valves with all of the remaining shutoff valves being kept closed to provide a respectively different pressure drop to liquid when passing through a respective one of said plurality of liquid supply paths.

12. The flow control system according to claim 11, wherein said flow meter is an ultrasonic flow meter, and wherein said pressure regulator comprises a valve chamber delimited by inner surfaces of a pair of diaphragms and upper and pneumatically controlled pressure chambers delimited by respective outer surfaces of said pair of diaphragms.

13. The flow control system according to claim 11, wherein said flow control system further comprises an electro pneumatic converter receiving control signals from said controller based upon readings of said flow meter and pneumatically controlling said pressure regulator based upon the control signals received from said controller.

14. The flow control system according to claim 11, wherein each of said shutoff valves is a solenoid-actuated diaphragm valve controlled by signals issued from said controller.

15. The flow control system according to claim 11, wherein said flow meter is contained within a first module, said controller is contained within a second module, and said pressure regulator and said shutoff valves are contained within a third module.

* * * * *